(12) United States Patent
Zhang et al.

(10) Patent No.: US 11,322,298 B2
(45) Date of Patent: May 3, 2022

(54) INTEGRATED COMMON MODE AND DIFFERENTIAL MODE INDUCTORS WITH LOW NEAR MAGNETIC FIELD EMISSION

(71) Applicant: University of Florida Research Foundation, Incorporated, Gainesville, FL (US)

(72) Inventors: Huan Zhang, Gainesville, FL (US); Shuo Wang, Gainesville, FL (US)

(73) Assignee: University of Florida Research Foundation, Incorporated, Gainesville, FL (US)

(*) Notice: Subject to any disclaimer, the term of this patent is extended or adjusted under 35 U.S.C. 154(b) by 405 days.

(21) Appl. No.: 16/127,728

(22) Filed: Sep. 11, 2018

(65) Prior Publication Data

US 2019/0096571 A1    Mar. 28, 2019

Related U.S. Application Data

(60) Provisional application No. 62/559,025, filed on Sep. 15, 2017.

(51) Int. Cl.
| | |
|---|---|
| H01F 27/24 | (2006.01) |
| H01F 27/34 | (2006.01) |
| H03H 1/00 | (2006.01) |
| H01F 3/14 | (2006.01) |
| H01F 27/28 | (2006.01) |
| H01F 30/12 | (2006.01) |
| H01F 27/30 | (2006.01) |

(52) U.S. Cl.
CPC ............ *H01F 27/346* (2013.01); *H01F 3/14* (2013.01); *H01F 27/24* (2013.01); *H01F 27/28* (2013.01); *H01F 27/306* (2013.01); *H01F 30/12* (2013.01); *H03H 1/00* (2013.01); *H03H 2001/0021* (2013.01); *H03H 2001/0092* (2013.01)

(58) Field of Classification Search
CPC ...... H01F 27/346; H01F 30/12; H01F 27/306; H01F 27/24; H01F 3/14; H01F 27/28; H03H 1/00; H03H 2001/0092; H03H 2001/0021
See application file for complete search history.

(56) References Cited

U.S. PATENT DOCUMENTS

| | | | | |
|---|---|---|---|---|
| 2,229,952 A | * | 1/1941 | Whiteley et al. | H03F 9/02 323/329 |
| 5,737,203 A | * | 4/1998 | Barrett | H02M 3/33561 363/75 |
| 6,281,776 B1 | * | 8/2001 | Davidson | H01F 27/22 336/178 |

(Continued)

*Primary Examiner* — Tuyen T Nguyen
(74) *Attorney, Agent, or Firm* — Alston & Bird LLP

(57) ABSTRACT

An integrated common mode and differential mode inductor can include a first core including a first center leg, a second core including a second center leg, a first center winding on the first center leg, and a second center winding on the second center leg. The first center leg can be spaced apart from the second center leg, for example by a center air gap. The integrated common mode and differential mode inductor can further include a left winding on a first left leg of the first core and a second left leg of the second core, as well as a right winding on a first right leg of the first core and a second right leg of the second core.

17 Claims, 13 Drawing Sheets

(56) References Cited

U.S. PATENT DOCUMENTS

| | | | |
|---|---|---|---|
| 8,120,457 B2* | 2/2012 | Hu | H01F 29/14 |
| | | | 336/178 |
| 10,910,150 B2* | 2/2021 | Clavijo | H01F 27/40 |
| 2009/0295524 A1* | 12/2009 | Silva | H01F 3/14 |
| | | | 336/170 |
| 2012/0262265 A1* | 10/2012 | Lo | H01F 41/026 |
| | | | 336/83 |

* cited by examiner

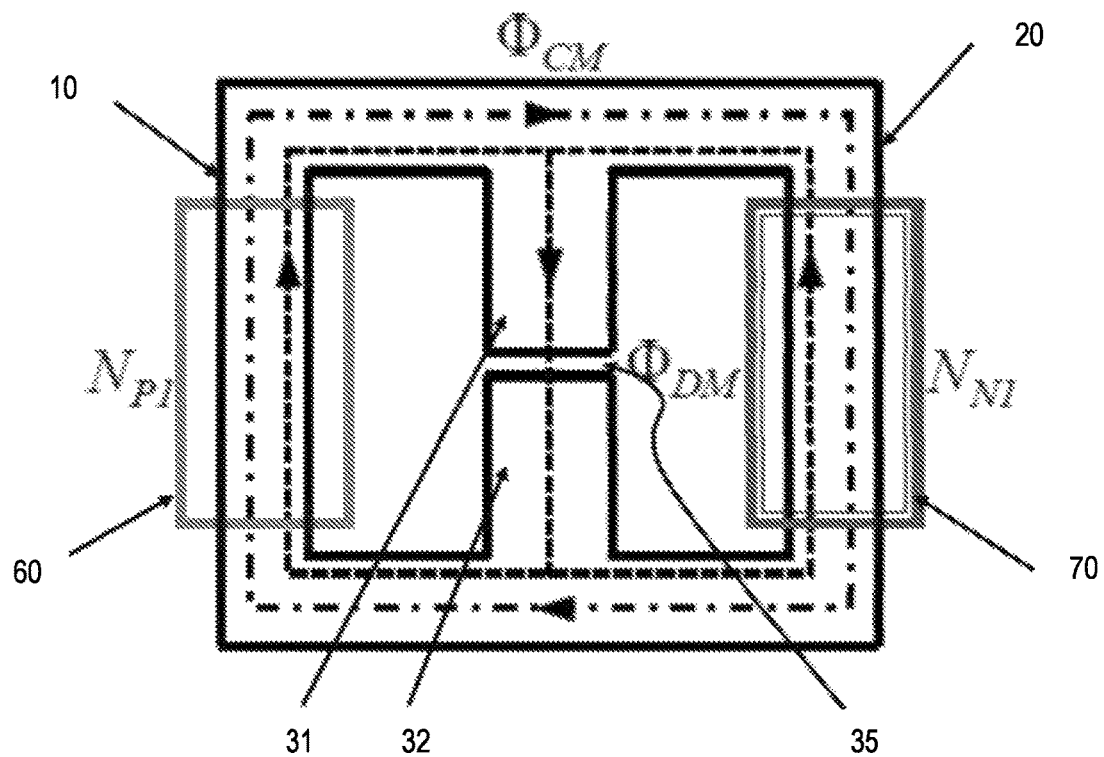
**Figure 1
(Related Art)**
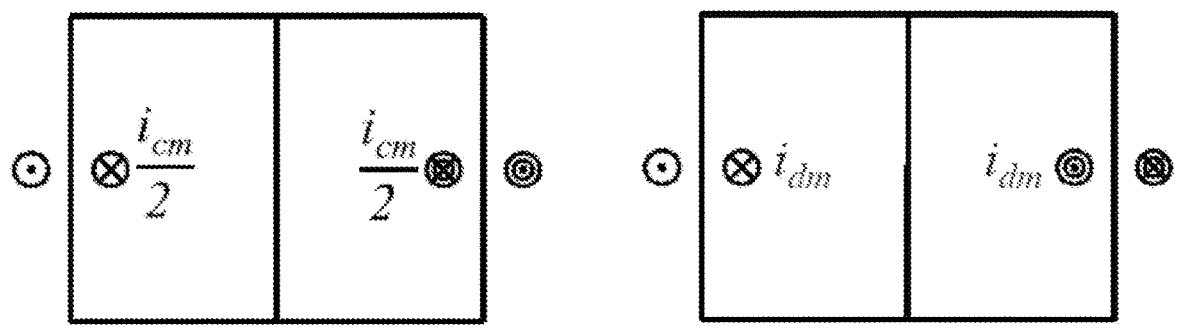
Figure 2A
Figure 2B
⊗ ⊙ } positive line current      ⊚ ⊚ } negative line current

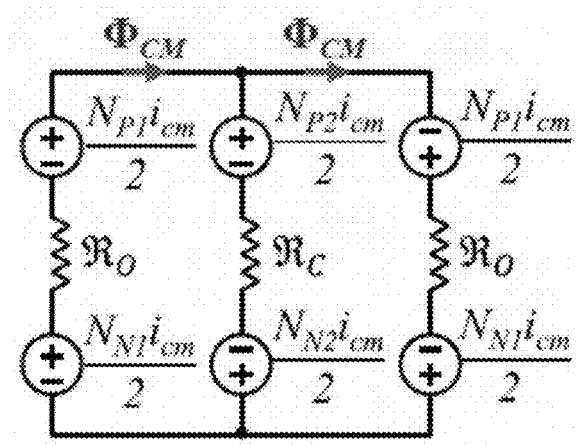
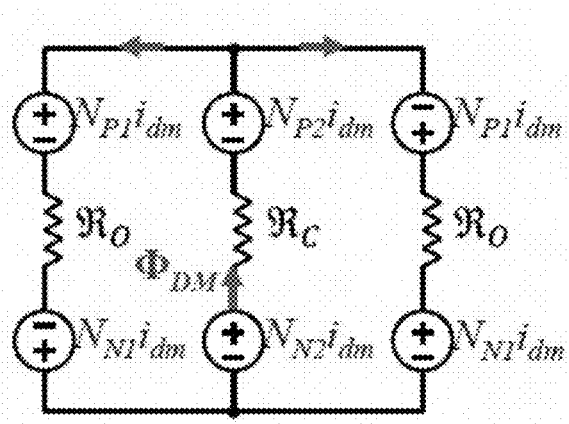
Figure 11A  Figure 11B
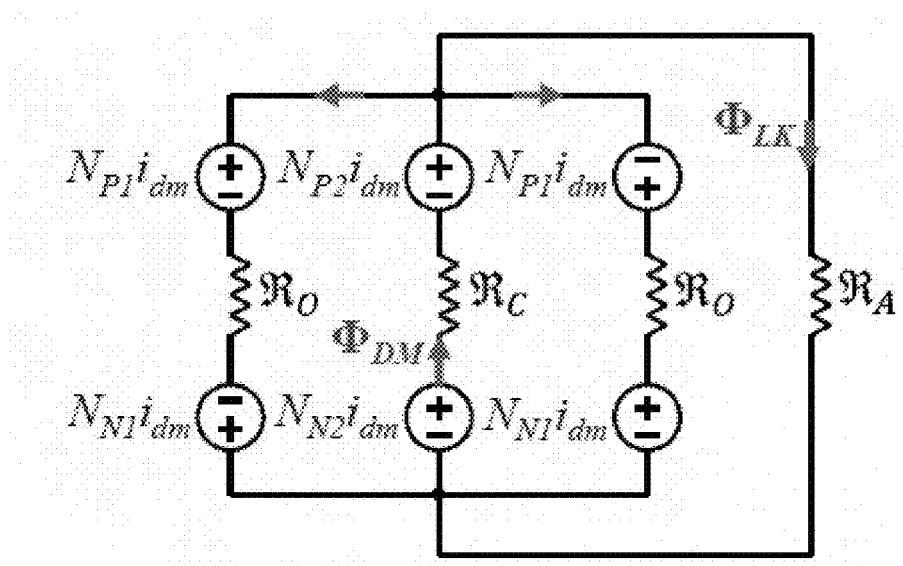
Figure 12

INTEGRATED COMMON MODE AND DIFFERENTIAL MODE INDUCTORS WITH LOW NEAR MAGNETIC FIELD EMISSION

CROSS-REFERENCE TO RELATED APPLICATIONS

This application claims priority to U.S. Application No. 62/559,025, filed Sep. 15, 2017, the content of which is herein incorporated in its entirety by reference.

BACKGROUND

Electromagnetic interference (EMI) has become a big concern for power electronics circuit designers due to the requirement of high switching frequency and high power density. Electrical components of power electronics are very spatially close to achieve low profile and high power density. In switching mode power converters, the magnetic components are used as energy storage to achieve energy transfer, current ripple reduction and EMI noise suppression. However, the near magnetic field emitted by the magnetic components, especially inductors, may reduce the performance of nearby components, especially EMI filters.

Therefore, there is a need in the art for improved switching mode power converters.

BRIEF SUMMARY OF SOME EXAMPLE EMBODIMENTS

As noted above, in switching mode power converters, the magnetic components are used as energy storage to achieve energy transfer, current ripple reduction and EMI noise suppression. However, the near magnetic field emitted by the magnetic components, especially inductors, may reduce the performance of nearby components, especially EMI filters. To reduce the near magnetic field couplings, an inductor with a smaller leakage field is preferred. However, the effort to reduce the leakage magnetic field sometimes may contradict the reduction of the EMI filter. For example, the leakage inductance of the common mode (CM) inductor is usually used as differential mode (DM) inductance for DM noise attenuation to reduce the EMI filter size. On the other hand, the leakage field leads to inductive couplings between filter components, which degrades EMI filter performance.

With respect to the contradiction, a stacked core structure for CM inductors has been considered for low near magnetic field and increased DM inductance. Nevertheless, the DM inductance may not be big enough in some applications. Integration techniques have been considered accordingly to integrate CM and DM inductors, but these techniques have not addressed the near magnetic field issue.

Embodiments of the subject invention provide novel and advantageous integrated common mode and differential mode inductors that comprise a first center winding on a first center leg and a second center winding on a second center leg, thereby reducing a near magnetic field.

In an embodiment, an integrated common mode and differential mode inductor can comprise an first core including an first center leg, a second core including a second center leg, an first center winding on the first center leg, and a second center winding on the second center leg, wherein the first center leg is spaced apart from the second center leg (e.g., by a center air gap).

In another embodiment, an integrated common mode and differential mode inductor can comprise a left leg wound by an first left winding and a second left winding, a right leg wound by an first right winding and a second right winding, an first center leg wound by an first center winding, and a second center leg wound by a second center winding, wherein the first center leg is spaced apart from the second center leg.

In yet another embodiment, an integrated common mode and differential mode inductor can comprise: an first core including an first left leg, an first center leg, and an first right leg; a second core including a second left leg, a second center leg, and a second right leg; a left winding wrapping the first left leg and the second left leg; a right winding wrapping the first right leg and the second right leg; an first center winding wrapping the first center leg; and a second center winding wrapping the second center leg.

In another embodiment, an integrated common mode and differential mode inductor can comprise an first body, a second body, a left leg connecting the first body and the second body at a left side, a right leg connecting the first body and the second body at a right side, an first center leg connected to the first body and located between the left leg and the right leg, a second center leg connected to the second body and located between the left leg and the right leg, an first left winding wrapping the left leg, a second left winding wrapping the left leg, an first center winding wrapping the first center leg, a second center winding wrapping the second center leg, an first right winding wrapping the right leg, and a second right winding wrapping the right leg, wherein the first center leg is spaced apart from the second center leg, and wherein the left leg, the first body, the right leg, and the second body are configured to make a loop shape.

BRIEF DESCRIPTION OF DRAWINGS

FIG. 1 shows a configuration of an integrated common mode and differential mode inductor.

FIG. 2A shows winding current directions of the integrated inductor of FIG. 1 when CM current is conducted.

FIG. 2B shows winding current directions of the integrated inductor of FIG. 1 when DM current is conducted.

FIG. 11A shows a magnetic circuit of the integrated inductor of FIG. 9 when CM current is conducted.

FIG. 11B shows a magnetic circuit of the integrated inductor of FIG. 9 when DM current is conducted.

FIG. 12 shows a magnetic circuit including a leakage magnetic flux of the integrated inductor of FIG. 9 with DM current excitation.

DETAILED DESCRIPTION

Figures 3A, 3B:
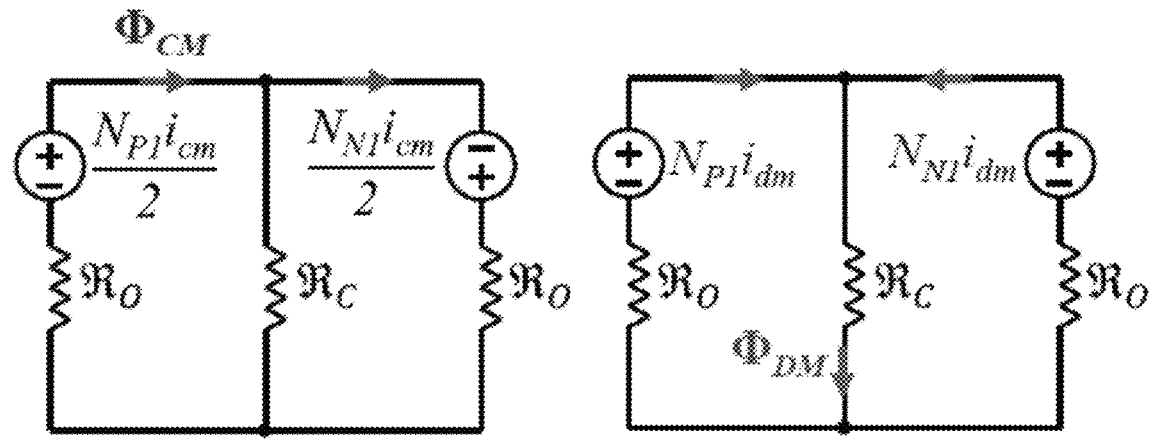
FIG. 3A shows a magnetic circuit of the integrated inductor of FIG. 1 when CM current is conducted.
FIG. 3B shows a magnetic circuit of the integrated inductor of FIG. 1 with DM current is conducted.

Embodiments of the present invention now will be described more fully hereinafter with reference to the accompanying drawings in which some but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout. As used herein, the term "approximately" refers to tolerances within manufacturing and/or engineering standards.

Embodiments of the subject invention provide novel and advantageous integrated common mode and differential mode inductors that comprise a first center winding on a first center leg and a second center winding on a second center leg, thereby reducing a near magnetic field.

Embodiments of the subject invention consider the near magnetic field of integrated CM and DM inductors. The reluctance models are considered for inductors and several integrated CM and DM inductor winding structures using EE/EI cores are considered to reduce or minimize the near magnetic field. In various embodiments EE cores are cores comprising two E-shaped portions and EI cores are cores comprising an E-shaped portion and an I-shaped portion. The conditions and limitations of near magnetic field cancellation are derived.

FIG. 1 shows a configuration of an integrated common mode and differential mode inductor. Referring to FIG. 1, the conventional integrated CM and DM inductor using EE core comprises a left leg 10, a right leg 20, a center leg 30, a left winding 60 wrapping the left leg 10, and a right winding 70 wrapping the right leg 20, wherein the center leg 30 includes an first center leg 31 and a second center leg 32. That is, the inductor has two winding groups including the left winding 60 and the right winding 70. A first winding number $N_{P1}$ and a second winding number $N_{N1}$ are the numbers of turns for the two windings, which are configured to be connected to a positive line on the left leg 10 and a negative line on the right leg 20. The CM flux flows through two outer legs of the left leg 10 and the right leg 20 with low reluctance (e.g., low magnetic resistance) while the DM flux flows through one outer leg (the left leg 10 or the right leg 20) and the center leg 30 with a center air gap 35. All the left winding 60 and the right winding 70 of the conventional integrated inductor work as both CM and DM windings so the CM and DM inductance cannot be separately adjusted with winding design.

FIGS. 2A and 2B show winding current directions of the integrated inductor of FIG. 1 when CM current and DM current are conducted, respectively. In FIGS. 2A and 2B, it is assumed that the positive direction of the CM current $i_{cm}$ is the same as that of the DM current $i_{dm}$ in the windings on the positive line. Referring to FIGS. 2A and 2B, the CM and DM current directions are therefore reversed in the windings on negative line. Based on the current directions in FIGS. 2A and 2B, the magnetic reluctance model without considering the leakage flux for the conventional integrated inductor can be derived as in FIGS. 3A and 3B.

FIGS. 3A and 3B show magnetic circuits of the integrated inductor of FIG. 1 when CM current and DM current are conducted, respectively. Referring to FIGS. 3A and 3B, $\Re_O$ and $\Re_C$ are defined as the reluctances of outer and center legs, respectively, and the magnetomotive forces (MMFs) are represented by voltage sources. If $N_{P1}=N_{N1}=N_1$, based on the winding current directions and the magnetic circuits, the CM and DM inductances of the conventional integrated inductor can be calculated:

$$L_{CM} = \frac{N_1^2}{2\Re_O} \quad (1)$$

$$L_{DM} = \frac{N_1^2}{\Re_C + \Re_O/2} \quad (2)$$

Figure 4:
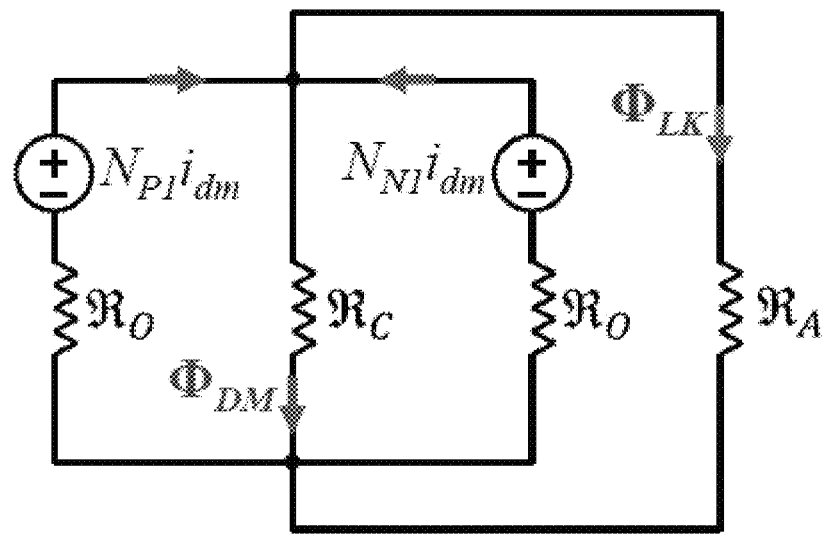
FIG. 4 shows a magnetic circuit of the integrated inductor of FIG. 1 when a leakage magnetic flux $\Phi_{LK}$ is considered.

The near magnetic field emission of the conventional integrated inductor can also be analyzed by examining its magnetic circuit with leakage flux considered as shown in FIG. 4. FIG. 4 shows a magnetic circuit of the integrated inductor of FIG. 1 when a leakage magnetic flux $\Phi_{LK}$ is considered. In most of power electronics applications cases, DM current is much larger than CM current, thus DM current is a major source of near magnetic field. Because of this, only the magnetic circuit for DM current is considered in FIG. 4. $\Phi_{LK}$ is the leakage flux that causes near magnetic field. $\Re_A$ is the air's equivalent reluctance.

The $\Phi_{LK}$ can be calculated by (3) based on FIG. 4. Since $\Re_O$ is small due to the high permeability of magnetic material and $\Re_C$ is large due to the air gap, the denominator of (3) is not big enough to reduce $\Phi_{LK}$. Thus, in conventional integrated inductors, a considerable near magnetic field is generated.

$$\Phi_{LK} = \frac{2N_1 i_{dm}}{2\Re_A + \Re_O + \Re_O \Re_A/\Re_C} \quad (3)$$

Figure 5A:
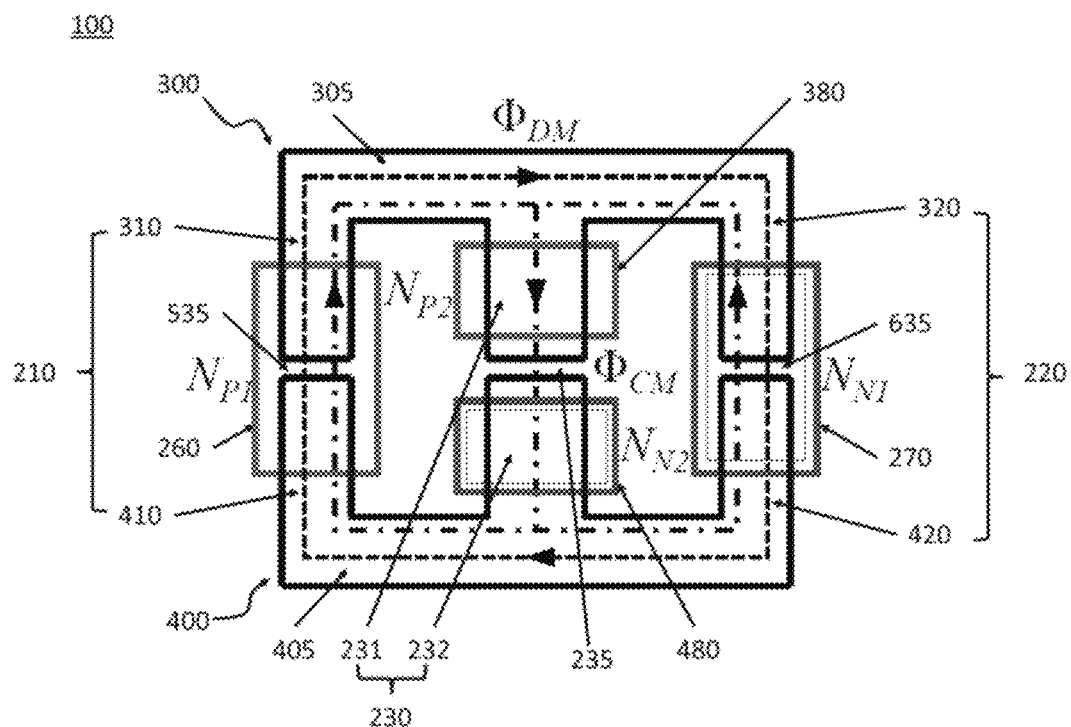
FIG. 5A shows an integrated common mode and differential mode inductor according to an embodiment of the subject invention.
Figure 5B:
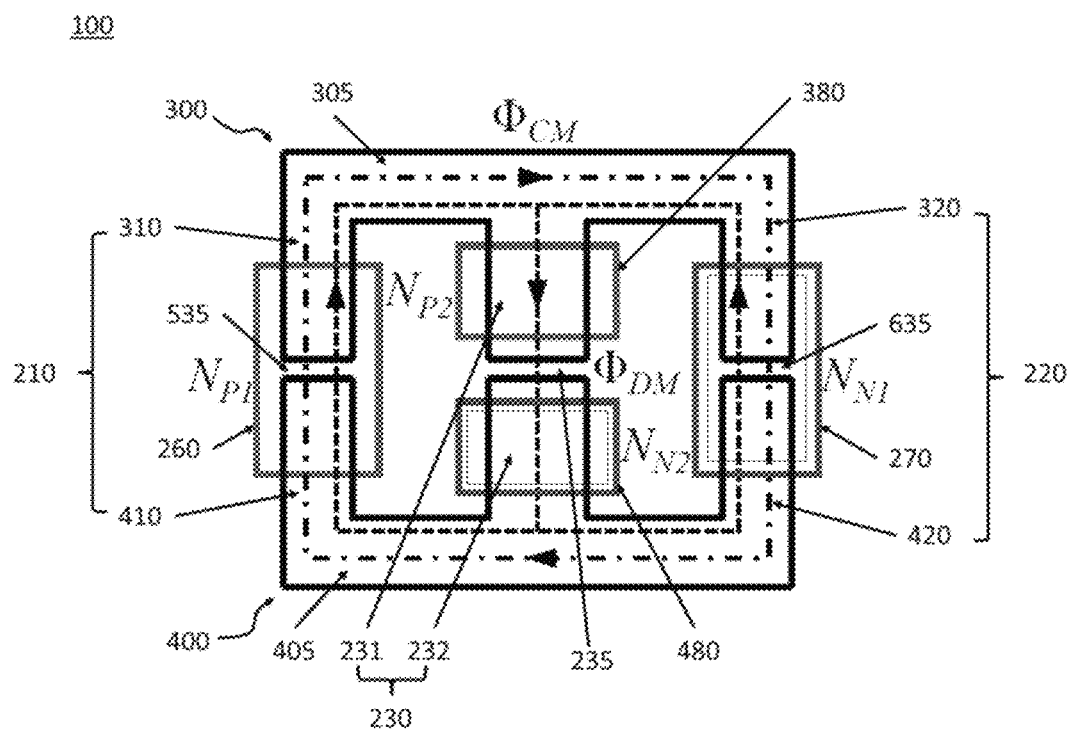
FIG. 5B shows an integrated common mode and differential mode inductor according to an embodiment of the subject invention.

FIGS. 5A and 5B show integrated common mode and differential mode inductors, according to various embodiments of the subject invention. Referring to FIGS. 5A and 5B, an integrated common mode and differential mode inductor 100 comprises an first core 300 including an first left leg 310, an first center leg 231, and an first right leg 320; and a second core 400 including a second left leg 410, a second center leg 232, and a second right leg 420. The first core 300 further includes an first body 305 connected to the first left leg 310, the first center leg 231, and the first right leg 320; and the second core 400 further includes a second body 405 connected to the second left leg 410, the second center leg 232, and the second right leg 420.

In the integrated inductor 100, a left leg 210 includes the first left leg 310 and the second left leg 410, a center leg 230 includes the first center leg 231 and the second center leg 232, and a right leg 220 includes the first right leg 320 and the second right leg 420. The first left leg 310 is spaced apart from the second left leg 410 by a left air gap 535, the first center leg 231 is spaced apart from the second center leg 232 by a center air gap 235, and the first right leg 320 is spaced apart from the second right leg 420 by a right air gap 635. Each of the left air gap 535, the right air gap 635, and the center air gap 235 has the same length. In other words, the space between the first right leg 320 and the second right leg 420 is the same size as the space between the first center leg 231 and the second center leg 232 and first left leg 310 and the second left leg 410.

The integrated inductor 100 further comprises a left winding 260 wrapping the first left leg 310 and the second left leg 410, a right winding 270 wrapping the first right leg 320 and the second right leg 420, an first center winding 380 wrapping the first center leg 231, and a second center winding 480 wrapping the second center leg 232.

In order to reduce the near magnetic field, two methods can be considered for the integrated single-phase inductor using EE cores in FIGS. 5A and 5B. Each leg has an air gap and all air gaps have the same length. A first winding number $N_{P1}$ and a third winding number $N_{P2}$ are the numbers of turns for the two series windings the left winding 260 and the first center winding 380 configured to be connected to a positive line on the left leg 210 and on the first center leg 231. A second winding number $N_{N1}$ is the number of turns for the right winding 270 and a fourth winding number $N_{N2}$ is the number of turns for the second center winding 480 configured to be connected to a negative line on the right leg 220 and on the second center leg 232. The difference between these two structures of FIGS. 5A and 5B lies in different paths for DM flux $\Phi_{DM}$ and CM flux $\Phi_{CM}$. For a structure of FIG. 5A, $\Phi_{DM}$ only flows through the outer legs of the left leg 210 and the right leg 220 while $\Phi_{CM}$ flows through both outer and center legs. For a structure of FIG. 5B, the configuration is opposite.

Figure 6A:
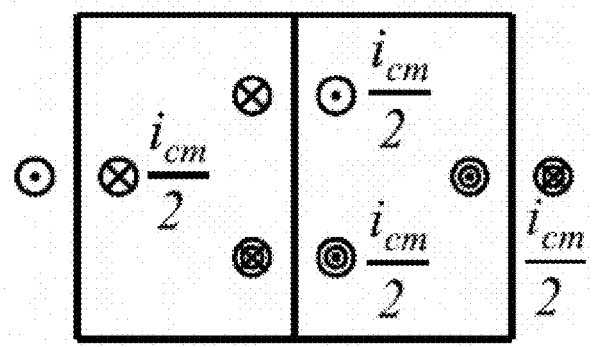
FIG. 6A shows winding current directions of the integrated inductor of FIG. 5A when CM current is conducted.
Figure 6B:
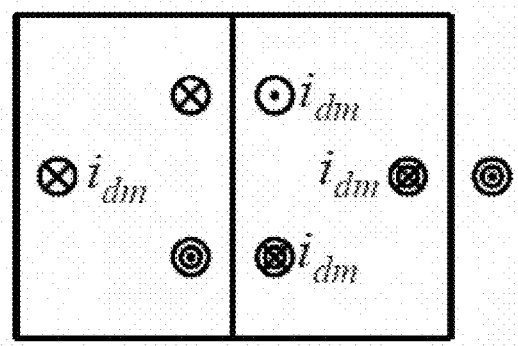
FIG. 6B shows winding current directions of the integrated inductor of FIG. 5A when DM current is conducted.
Figure 6C:
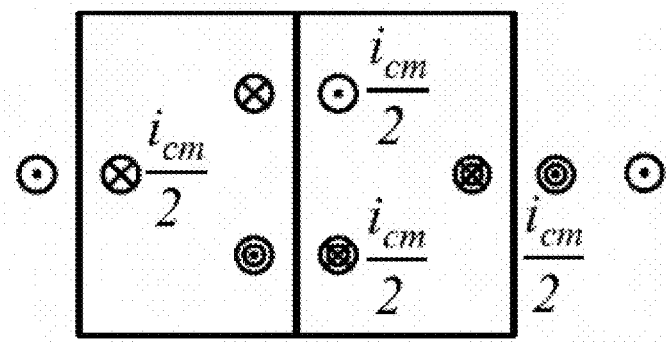
FIG. 6C shows winding current directions of the integrated inductor of FIG. 5B when CM current is conducted.
Figure 6D:
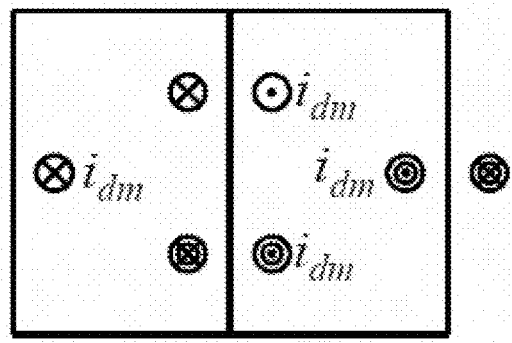
FIG. 6D shows winding current directions of the integrated inductor of FIG. 5B when DM current is conducted.

FIGS. 6A and 6B show winding current directions of the integrated inductor of FIG. 5A when CM current and DM current are conducted, respectively, and FIG. 6C and show winding current directions of the integrated inductor of FIG. 5B when CM current and DM current conducted, respectively. In FIGS. 6A-6D, it is assumed that the positive direction of the CM current $i_{cm}$ is the same as that of the DM current $i_{dm}$ in the windings on the positive line. Referring to FIGS. 6A-6D, the CM and DM current directions are therefore different in the windings on the negative line. Based on the current directions in FIGS. 6A-6D, the magnetic reluctance circuits without considering the leakage flux for the two integrated inductor structures can be derived as in FIGS. 7A-7D.

Figure 7A:
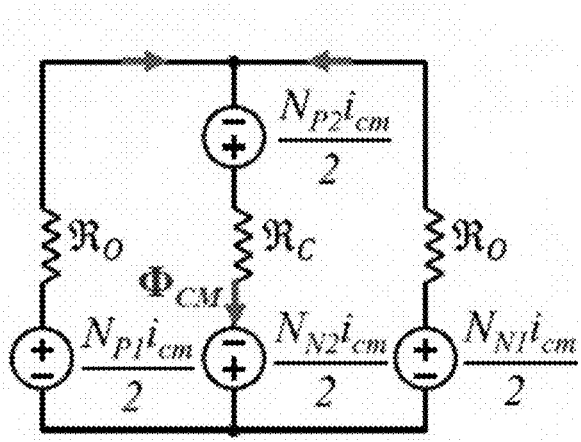
FIG. 7A shows a magnetic circuit of the integrated inductor of FIG. 5A when CM current is conducted.
Figure 7B:
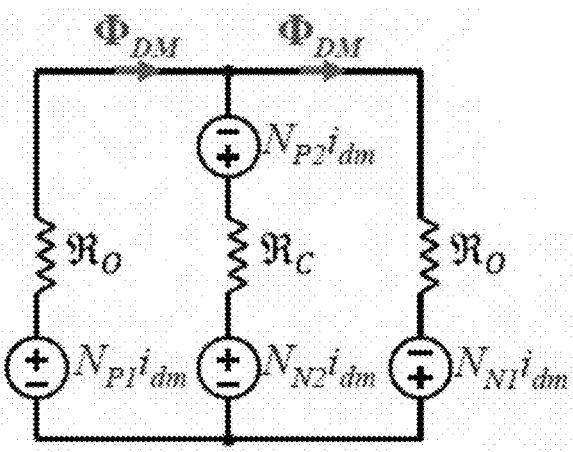
FIG. 7B shows a magnetic circuit of the integrated inductor of FIG. 5A when DM current is conducted.
Figure 7C:
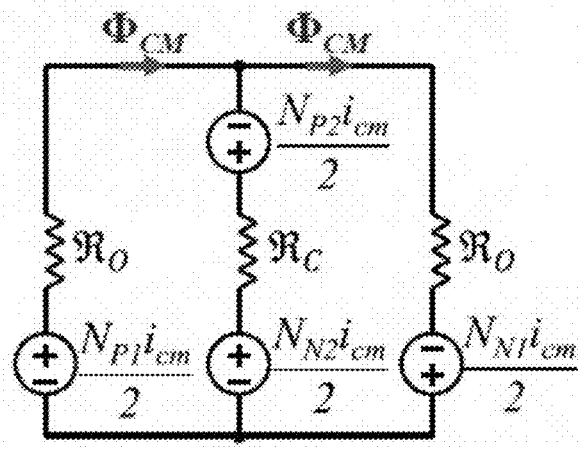
FIG. 7C shows a magnetic circuit of the integrated inductor of FIG. 5B when CM current is conducted.
Figure 7D:
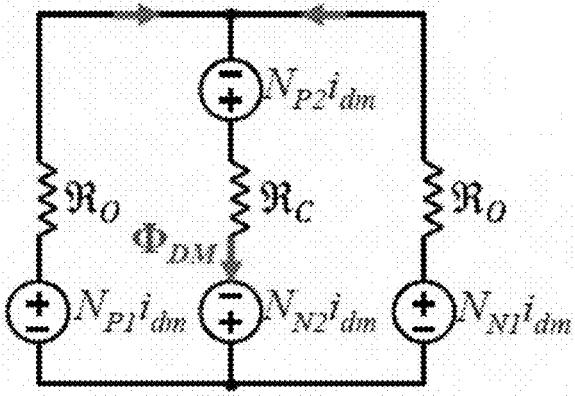
FIG. 7D shows a magnetic circuit of the integrated inductor of FIG. 5B when DM current is conducted.

FIGS. 7A and 7B show magnetic circuits of the integrated inductor of FIG. 5A when CM current and DM current are conducted, respectively. FIGS. 7C and 7D show magnetic circuits of the integrated inductor of FIG. 5B when CM current and DM current are conducted, respectively. By applying superposition theory, it can be proven that if $N_{P2}=N_{N2}=N2$, the magnetomotive forces (MMFs) on the center leg 230 in FIGS. 7B and 7C cancel each other. This complies with the flux described in FIGS. 5A and 5B. If $N_{P1}=N_{N1}=N_1$, the CM and DM inductances for both structures of FIGS. 5A and 5B can be calculated as follows:

$$L_{CM1} = \frac{(N_1 + 2N_2)^2}{4\Re_C + 2\Re_O} \quad (4)$$

$$L_{DM1} = \frac{2N_1^2}{\Re_O} \quad (5)$$

$$L_{CM2} = \frac{N_1^2}{2\Re_O} \quad (6)$$

$$L_{DM2} = \frac{(N_1 + 2N_2)^2}{\Re_C + \Re_O/2} \quad (7)$$

Figure 8A:
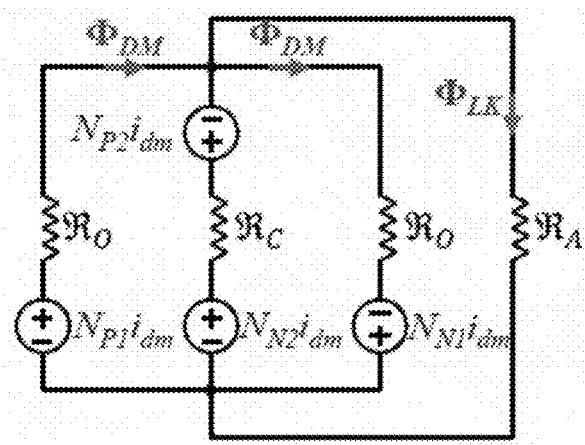
FIG. 8A shows a magnetic circuit of the integrated inductor of FIG. 5A with DM current excitation when a leakage magnetic flux $\Phi_{LK}$ is considered.
Figure 8B:
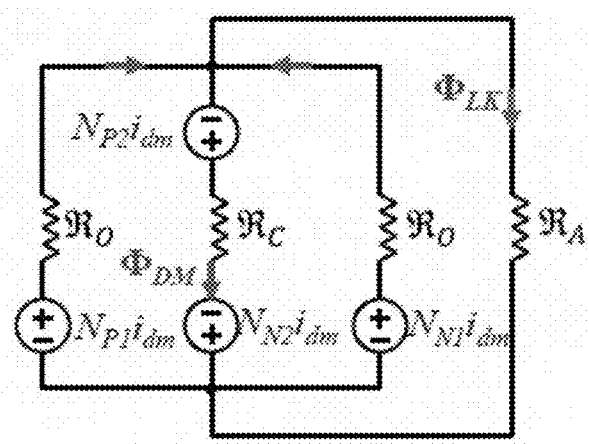
FIG. 8B shows a magnetic circuit of the integrated inductor of FIG. 5B with DM current excitation when a leakage magnetic flux $\Phi_{LK}$ is considered.

FIGS. 8A and 8B show magnetic circuits of the integrated inductor of FIGS. 5A and 5B, respectively, with DM current excitation when a leakage magnetic flux $\Phi_{LK}$ is considered. The near magnetic field emission for the two structures of FIGS. 5A and 5B can be analyzed by examining their magnetic circuits with leakage flux considered as in FIGS. 8A and 8B. Similar to conventional inductors, only the magnetic circuits for DM current are considered because DM current is the major source of near magnetic field.

Referring to FIG. 8A, the condition to fully cancel $\Phi_{LK}$ can be derived based on the circuit: a) $N_{P1}=N_{N1}=N_1$ so that the leakage fluxes generated by MMF $N_{P1}i_{dm}$ and $N_{N1}i_{dm}$ can get cancelled; b) $N_{P2}=N_{N2}=N_2$ so that the leakage fluxes generated by MMF $N_{P2}i_{dm}$ and $N_{N2}i_{dm}$ can get cancelled.

Referring to FIG. 8B, the condition to fully cancel $\Phi_{LK}$ can be derived based on the circuit: $(N_{P1}+N_{N1})/\Re_O=(N_{P2}+N_{N2})/\Re_C$. If $N_{P1}=N_{N1}=N_1$ and $N_{P2}=N_{N2}=N_2$, the condition can be simplified as: $N_1/\Re_O=N_2/\Re_C$. If the conditions are not fully met, $\Phi_{LK}$ gets partially cancelled (e.g., reduced) instead. For both structures, large reluctances or air gaps can be needed on DM flux paths to store energy and avoid core saturation. Based on (5), for the structure of FIG. 5A, $\Re$ should be big, and as a result, CM inductance in (4) is limited. For CM inductance, core saturation is not a big concern; a relatively small reluctance is usually preferred to reduce number of winding turns. However, because there are air gaps in its major flux paths, big number of turns is needed to achieve enough CM inductance. Similarly, the limitation on CM inductance also exists for the structure FIG. 5B. From (6) and (7), although it seems possible to use a small $\Re$ to get a large CM inductance and a big $\Re_C$ to avoid core saturation, the $\Phi_{LK}$ cancellation condition described previously becomes difficult to meet. With a large ratio of $\Re_C$ to $\Re$, $N_2$ to $N_1$ ratio also has to be very large in order to cancel $\Phi_{LK}$.

Figure 9:
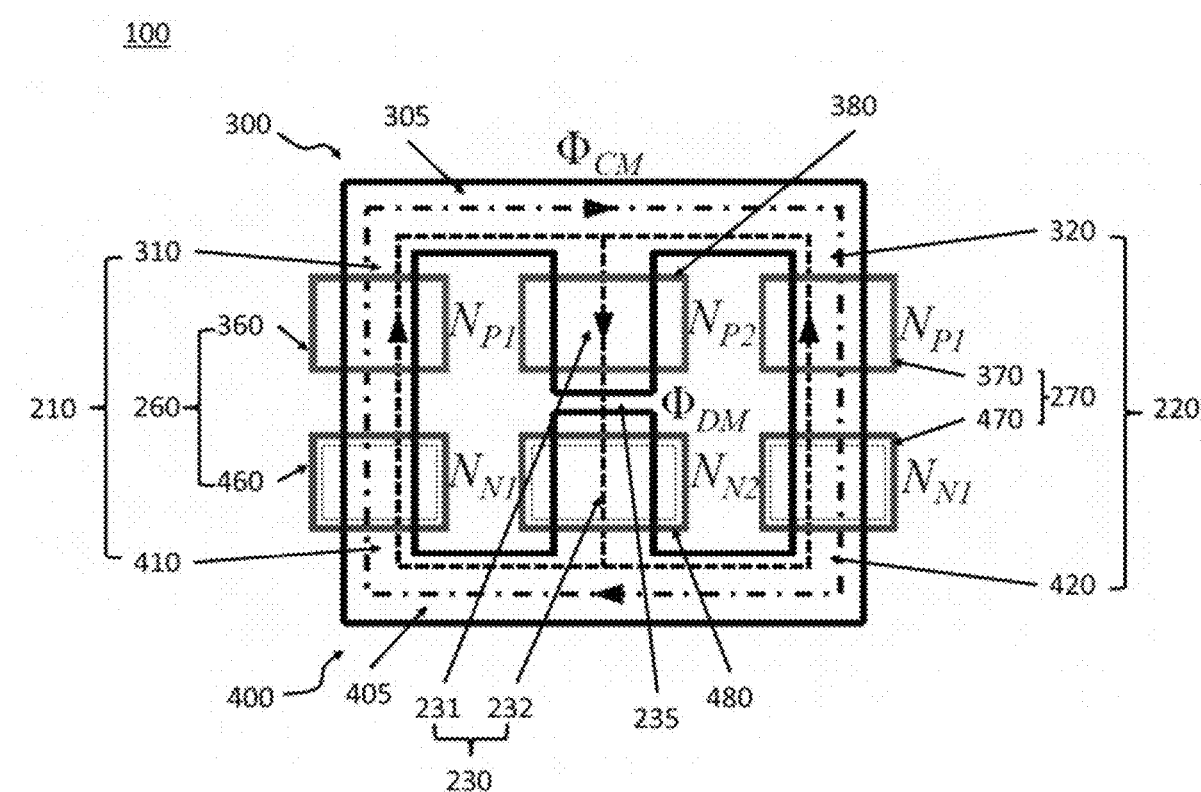
FIG. 9 shows an integrated common mode and differential mode inductor according to an embodiment of the subject invention.

FIG. 9 shows an integrated common mode and differential mode inductor according to an embodiment of the subject invention. In order to overcome the CM inductance limitation of the two structures of FIGS. 5(a) and 5(b), a new structure of an integrated inductor of FIG. 9 according to an embodiment of the subject invention is configured such that only the center leg has an air gap.

Referring to FIG. 9, an integrated common mode and differential mode inductor 100 comprises a left leg 210 including an first left leg 310 and a second left leg 410, a right leg 220 including an first right leg 320 and a second right leg 420, and a center leg 230 including an first center leg 231 and a second center leg 232.

The first left leg 310, the first center leg 231, and the first right leg 320 are connected to a first body 305, and the second left leg 410, the second center leg 232, and the second right leg 420 are connected to a second body 405. The first left leg 310 and the second left leg 410 are connected to the first body 305 and the second body 405 at a left side, respectively, and the first right leg 320 and the second right leg 420 are connected to the first body 305 and the second body 405 at a right side, respectively. While the first center leg 231 and the second center leg 232 are spaced apart from each other by a center air gap 235, the first left leg 310 and the second left leg 410 are directly connected to each other without an air gap. Similarly, the first right leg 320 is directly connected to the second right leg 420 without an air gap. That is, the left leg 210, the first body 305, the right leg 220, and the second body 405 are configured to make a loop shape without an air gap.

The integrated inductor 100 of FIG. 9 further comprises a left winding 260 including an first left winding 360 and a second left winding 460, and a right winding 270 including an first right winding 370 and the a second right winding 470. The first left winding 360 wraps the first left leg 310 and the second left winding 460 wraps the second left leg 410. The first right winding 370 wraps the first right leg 320 and the second right winding 470 wraps the second right leg 420. The first left winding 360, the first right winding 370, and the first center winding 380, which are wrapped around respective legs of the first core 300, are configured to be connected to a positive line. The second left winding 460, the second right winding 470, and the second center winding 480, which are wrapped around respective legs of the second core 400, are configured to be connected to a negative line.

Each of the first left winding 360 and the first right winding 370 has a first winding number $N_{P1}$ that represents a number of turns, and each of the second left winding 410 and the second right winding 470 has a second winding number $N_{N1}$ that represents a number of turns of the winding. The first center winding 380 has a third winding number $N_{P2}$ and the second center winding 480 has a fourth winding number $N_{N2}$.

Different from the previous two structures of FIGS. 5A and 5B, the structure of FIG. 9 includes three series windings on three legs respectively on both a positive line and a negative line. A common mode flux $\Phi_{CM}$ only flows through the outer legs including the left leg 210 and the right leg 220 while a differential mode flux $\Phi_{DM}$ flows through both the outer and center legs. There are no air gaps on the outer legs 210 and 220 so a big CM inductance can be achieved.

Figure 10A:
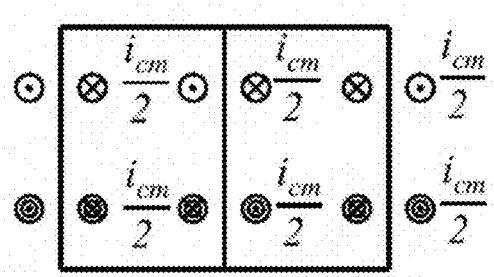
FIG. 10A shows winding current directions of the integrated inductor of FIG. 9 when CM current is conducted.
Figure 10B:
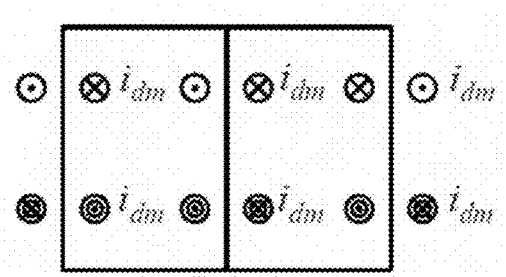
FIG. 10B shows winding current directions of the integrated inductor of FIG. 9 when DM current is conducted.

FIGS. 10A and 10B show winding current directions of the integrated inductor of FIG. 9 when CM current and DM current are conducted, respectively, and FIGS. 11A and 11B show magnetic circuits of the integrated inductor of FIG. 9 when CM current and DM current are conducted, respectively. FIG. 12 shows a magnetic circuit including a leakage magnetic flux of the integrated inductor of FIG. 9 with DM current excitation. For the same reason as before, only the near magnetic field generated by DM currents is considered, and the resultant magnetic circuit with the DM leakage flux $\Phi_{LK}$ included is shown as FIG. 12.

By applying superposition theory, it can be proven that if $N_{P2}=N_{N2}=N_2$, the CM MMFs on center leg in FIG. 11A cancel each other; if $N_{P1}=N_{N1}=N_1$, the DM MMFs on the left and right legs in FIG. 11B cancel each other. The CM and DM inductances can then be calculated:

$$L_{CM3} = \frac{2N_1^2}{\mathfrak{R}_O} \quad (8)$$

$$L_{DM3} = \frac{4N_2^2}{\mathfrak{R}_C + \mathfrak{R}_O/2} \quad (9)$$

The mechanism of near magnetic field reduction in a structure of FIG. 9 is different from that in the structures of FIGS. 5A and 5B. In FIG. 12, since the MMFs on the left and right legs cancel each other, only the MMFs on the center leg contribute to DM leakage flux (near magnetic field emission). Both MMFs generate magnetic fluxes in the same direction, so the leakage flux $\Phi_{LK}$ generated by them cannot get cancelled and it can be calculated by:

$$\Phi_{LK} = \frac{2N_2 i_{dm}}{2\mathfrak{R}_A \mathfrak{R}_C / \mathfrak{R}_O + \mathfrak{R}_C + \mathfrak{R}_A} \quad (10)$$

Equation (10) shows that, in order to get a small $\Phi_{LK}$, a small $\mathfrak{R}$ and a big $\mathfrak{R}_C$ is preferred. The structure of FIG. 9 meets this condition, so low near magnetic field can be guaranteed.

Embodiments of the subject invention include, but are not limited to, the following exemplified embodiments.

Embodiment 1. An integrated common mode and differential mode inductor, comprising a first core including a first center leg; a second core including a second center leg; a first center winding on the first center leg; and a second center winding on the second center leg; wherein the first center leg is (physically) spaced apart from the second center leg (e.g., by a center air gap).

Embodiment 2. The integrated common mode and differential mode inductor of embodiment 1, wherein the first core includes an first left leg and an first right leg such that the first center leg is located between (horizontally) the first left leg and the first right leg and the second core includes a second left leg and a second right leg such that the second center leg is located between (horizontally) the second left leg and the second right leg.

Embodiment 3. The integrated common mode and differential mode inductor according to embodiment 2, wherein the first left leg is (physically) spaced apart from the second left leg (e.g., by a left air gap) and the first right leg is (physically) spaced apart from the second right leg (e.g., by a right air gap).

Embodiment 4. The integrated common mode and differential mode inductor according to embodiment 3, wherein the left air gap, the right air gap, and the center air gap have the same length (or thickness) (i.e., the first and second left legs, the first and second center legs, and the first and second right legs are separated from each other by the same distance).

Embodiment 5. The integrated common mode and differential mode inductor according to any of embodiments 3-4, further comprising a left winding on the first left leg and the second left leg, and a right winding on the first right leg and the second right leg.

Embodiment 6. The integrated common mode and differential mode inductor according to embodiment 5, wherein the left winding and the first center winding are configured to be connected to a positive line, and the right winding and the second center winding are configured to be connected to a negative line.

Embodiment 7. The integrated common mode and differential mode inductor according to any of embodiments 5-6, wherein each current direction of the left, right, first center, and second center windings is configured such that a differential mode flux flows through the first left, second left, first right, and second right legs, and a common mode flux flows through the first left, second left, first right, second right, first center, and second center legs.

Embodiment 8. The integrated common mode and differential mode inductor according to any of embodiments 5-6, wherein each current direction of the left, right, first center, and second center windings is configured such that a common mode flux flows through the first left, second left, first right, and second right legs, and a differential mode flux flows through the first left, second left, first right, second right, first center, and second center legs.

Embodiment 9. The integrated common mode and differential mode inductor according to any of embodiments 5-8, wherein a first winding number of the left winding is the same as a second winding number of the right winding.

Embodiment 10. The integrated common mode and differential mode inductor according to any of embodiments 5-9, wherein a third winding number of the first center winding is the same as a fourth winding number of the second center winding.

Embodiment 11. The integrated common mode and differential mode inductor according to any of embodiments 5-8, wherein (a) each of a left leg including the first left leg and the second left leg, and a right leg including the first right leg and the second right leg has an outer reluctance, (b) a center leg including the first center leg and the second center leg has a center reluctance, and (c) a first winding number of the left winding, a second winding number of the right winding, a third winding number of the first center winding, and a fourth winding number of the second center winding are defined such that a first ratio of a first total number adding the first winding number to the second winding number with respect to the outer reluctance is the same as a second ratio of a second total number adding the third winding number to the fourth winding number with respect to the center reluctance (e.g., ratio of (first winding number+second winding number):outer reluctance=ratio of (third winding number+fourth winding number):center reluctance).

Embodiment 12. An integrated common mode and differential mode inductor, comprising a left leg wound by an first left winding and a second left winding; a right leg wound by an first right winding and a second right winding; an first center leg wound by an first center winding; and a second center leg wound by a second center winding, wherein the first center leg is (physically) spaced apart from the second center leg (e.g., by an air gap).

Embodiment 13. The integrated common mode and differential mode inductor according to embodiment 12, wherein the left leg includes a first left leg wound by the first left winding and a second left leg wound by the second left winding, and wherein the first left leg is directly connected to the second left leg (e.g., there is not air gap between the first left leg and the second left leg).

Embodiment 14. The integrated common mode and differential mode inductor according to any of embodiments 12-13, wherein the right leg includes an first right leg wound by the first right winding and a second right leg wound by the second right winding, and wherein the first right leg is directly connected to the second right leg (e.g., there is no air gap between the first right leg and the second right leg).

Embodiment 15. The integrated common mode and differential mode inductor according to any of embodiments 12-14, wherein the first left winding, the first right winding, and the first center winding are configured to be connected to a positive line and wherein the second left winding, the second right winding, and the second center winding are configured to be connected to a negative line.

Embodiment 16. The integrated common mode and differential mode inductor according to any of embodiments 12-15, wherein each of the first left winding and the first right winding has a first winding number, each of the second left winding and the second right winding has a second winding number, and the first winding number is the same as the second winding number.

Embodiment 17. The integrated common mode and differential mode inductor according to any of embodiments 12-16, wherein the first center winding has a third winding number, the second center winding has a fourth winding number, and the third winding number is the same as the fourth winding number.

Embodiment 18. The integrated common mode and differential mode inductor according to any of embodiments 12-17, wherein each winding current direction of the first left winding, the first right winding, the first center winding, the second left winding, the second right winding, and the second center winding is configured such that a common mode flux flows through the left leg and the right leg, and a differential mode flux flows through the left leg, the right leg, the first center leg, and the second center leg.

Embodiment 19. An integrated common mode and differential mode inductor, comprising a first core including a first left leg, a first center leg, and a first right leg; a second core including a second left leg, a second center leg, and a second right leg; a left winding wrapping the first left leg and the second left leg; a right winding wrapping the first right leg and the second right leg; a first center winding wrapping the first center leg; and a second center winding wrapping the second center leg.

Embodiment 20. The integrated common mode and differential mode inductor according to embodiment 19, wherein the first left leg, the first center leg, and the first right leg are (physically) spaced apart from the second left leg, the second center leg, and the second right leg, respectively, by an air gap.

Embodiment 21. The integrated common mode and differential mode inductor according to any of embodiments 19-20, wherein the first core includes a first body connected to the first left leg, the first center leg, and the first right leg, and the second core includes a second body connected to the second left leg, the second center leg, and the second right leg.

Embodiment 22. The integrated common mode and differential mode inductor according to embodiment 21, wherein a common mode flux flows from the first left leg and the first right leg to the first center leg through the first body, and a differential mode flux flows from the first left leg to the first right leg through the first body.

Embodiment 23. The integrated common mode and differential mode inductor according to embodiment 21, wherein a common mode flux flows the first left leg to the first right leg through the first body, and a differential mode flux flows from the first left leg and the first right leg to the first center leg through the first body.

Embodiment 24. The integrated common mode and differential mode inductor according to any of embodiments 19-23, wherein a first winding number of the left winding is the same as a second winding number of the right winding.

Embodiment 25. The integrated common mode and differential mode inductor according to any of embodiments 19-24, wherein a third winding number of the first center winding is the same as a fourth winding number of the second center winding.

Embodiment 26. An integrated common mode and differential mode inductor, comprising a first body; a second body; a left leg connecting the first body and the second body at a left side; a right leg connecting the first body and the second body at a right side; a first center leg connected to the first body and located between the left leg and the right leg; a second center leg connected to the second body and located between the left leg and the right leg; a first left winding wrapping the left leg; a second left winding wrapping the left leg; a first center winding wrapping the first center leg; a second center winding wrapping the second center leg; a first right winding wrapping the right leg; and a second right winding wrapping the right leg, wherein (a) the first center leg is (physically) spaced apart from the second center leg, and (b) the left leg, the first body, the right leg, and the second body are configured to make a loop shape.

Embodiment 27. The integrated common mode and differential mode inductor according to embodiment 26, wherein the left leg and the right leg directly connect the first body and the second body without any gap (e.g., without an air gap).

Embodiment 28. The integrated common mode and differential mode inductor according to any of embodiments 26-27, wherein a center (air) gap is disposed between the first center leg and the second center leg.

Embodiment 29. The integrated common mode and differential mode inductor according to any of embodiments 26-28, wherein each of the first left winding and the first right winding has a first winding number, each of the second left winding and the second right winding has a second winding number, and the first winding number is the same as the second winding number.

Embodiment 30. The integrated common mode and differential mode inductor according to any of embodiments 26-29, wherein a third winding number of the first center winding is the same as a fourth winding number of the second center winding.

A greater understanding of various embodiments of the present invention and their many advantages may be had from the following example, given by way of illustration. The following example shows some of the methods, applications, embodiments and variants of the present invention. They are, of course, not to be considered as limiting. Various changes and modifications can be made to the below example without departing from the scope of embodiments of the present invention.

Example 1

Figure 13A:
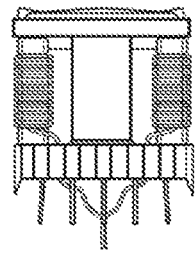
FIG. 13A shows an inductor prototype regarding a conventional integrated inductor of FIG. 1.
Figure 13B:
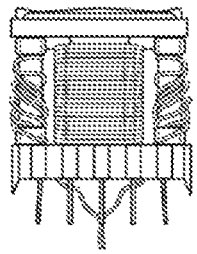
FIG. 13B shows an inductor prototype regarding a structure 1 of integrated inductor of FIG. 5A.
Figure 13C:
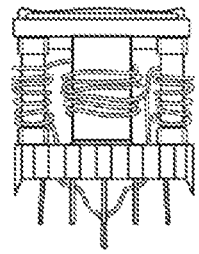
FIG. 13C shows an inductor prototype regarding a structure 2 of integrated inductor of FIG. 5B.
Figure 13D:
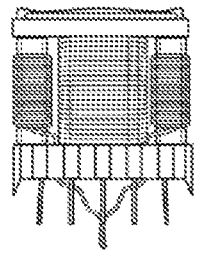
FIG. 13D shows an inductor prototype regarding a structure 3 of integrated inductor of FIG. 9.

FIGS. 13B, 13C, and 13D show inductor prototypes for experimental verification. FIG. 13A shows an exemplary conventional integrated inductor, FIG. 13B shows an exemplary embodiment of a structure of FIG. 5A (Structure 1), FIG. 13C shows an exemplary embodiment of a structure of FIG. 5B (Structure 2), and FIG. 13D shows an exemplary embodiment of a structure of FIG. 9 (Structure 3). The specific parameters are summarized in TABLE I. The number of turns N and the air gap length lg of each leg are shown in the TABLE I. It should be pointed out that the 0.005 mm air gaps between two EE cores on the outer legs in the conventional inductor and Structure 3 are the minimum air gap that can be achieved in the experiments. As such, there is approximately no gap between the first right leg and the second right leg of the conventional inductor and Structure 3 and there is approximately no gap between the first left leg and the second left leg of the conventional inductor and Structure 3. The maximum DM current of all inductors are 4 A. The maximum CM current is 0.5 A. TDK ferrite core E 20/10/6 with N27 materials are used for all designs and the maximum allowable B field is selected as 350 mT according to the datasheet.

TABLE 1

Parameters of the Integrated CM and DM Inductors

| | N left/right | N center | N total | L g_left/ right | L g_center |
|---|---|---|---|---|---|
| Conventional | 13 | 0 | 26 | 0.005 mm | 1.005 mm |
| Structure 1 | 9 | 44 | 62 | 0.19 mm | 0.19 mm |
| Structure 2 | 7 | 6 | 20 | 0.19 mm | 0.19 mm |
| Structure 3 | 12 | 18 | 42 | 0.005 mm | 1.005 mm |

To do a fair comparison, the DM and CM inductances of all inductors should be as close as possible and at the same time, the design should meet the near magnetic field cancellation condition. The design started from the conventional integrated inductor that doesn't have the ability to adjust its DM and CM inductance separately. Inductors with Structure 1 and Structure 3 can be designed accordingly to have similar DM and CM inductances to the conventional inductor. For Structure 2, only the DM inductance can be designed to be similar to that of the conventional inductor. Its CM inductance cannot be freely adjusted otherwise the near magnetic field cancellation condition cannot be met.

Figure 14:
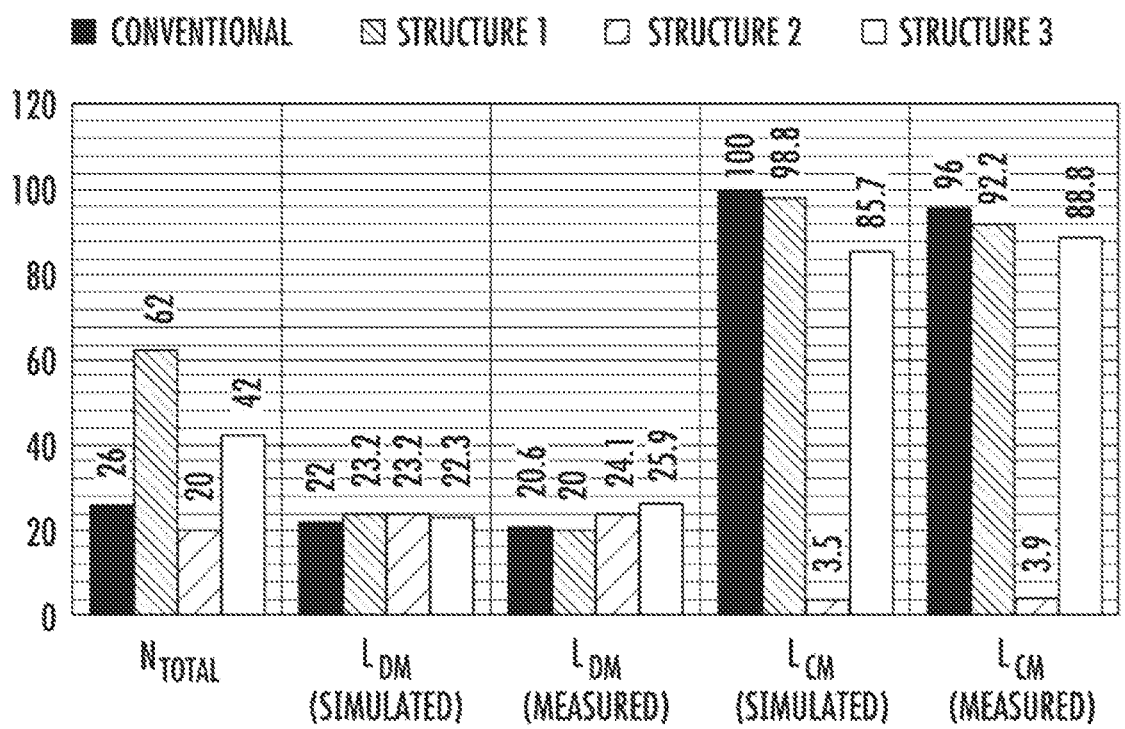
FIG. 14 shows comparison of the total number of turns, DM inductance, and CM inductance of the conventional integrated inductor shown in FIG. 13A and the inductor prototypes shown in FIGS. 13B, 13C, and 13D.

FIG. 14 shows the comparison of the DM and CM inductances and the total number of turns ($N_{total}$) of all inductors. For the inductance, experimental results match the simulation result very well. The measured DM inductances for all inductors are around 23 μH with a maximum 3 μH deviation. The measured CM inductances for the conventional inductor, the inductors of Structure 1 and Structure 3 are around 92 μH with a maximum 4 μH deviation. As discussed previously, the CM inductance of Structure 2 cannot be designed to be the same as the conventional. It is only 3.9 μH which is much smaller than the other three inductors.

For the total number $N_{total}$ of turns, Structure 2 uses the smallest $N_{total}$ of the four inductors at the price of the smallest $L_{CM}$. The conventional inductor shows an advantage over Structures 1 and 3 in this case since all of its turns are used as both the DM and CM windings. Its disadvantage is also obvious: the conventional inductor cannot adjust $L_{DM}$ and $L_{CM}$ separately. As a result, the conventional inductor could be easily overdesigned. In general, the structures of the embodiments of the subject invention use a larger number of turns to achieve much lower near magnetic field emission than the conventional inductor.

Figure 15A:
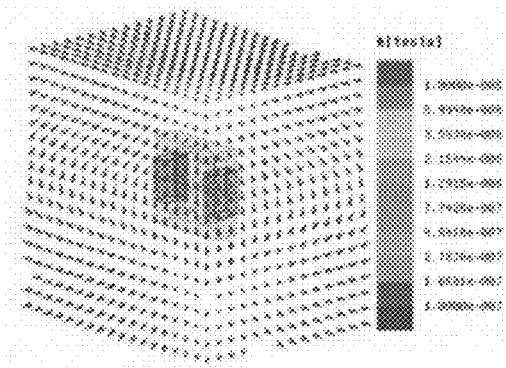
FIG. 15A shows simulated magnetic field vectors for a conventional integrated inductor of FIG. 13A with 1 A DM current.
Figure 15B:
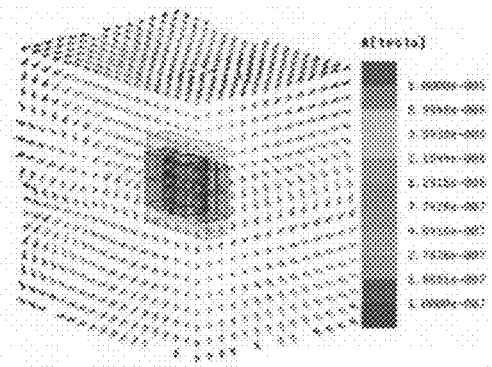
FIG. 15B shows simulated magnetic field vectors for a structure 1 of FIG. 13B with 1 A DM current.
Figure 15C:
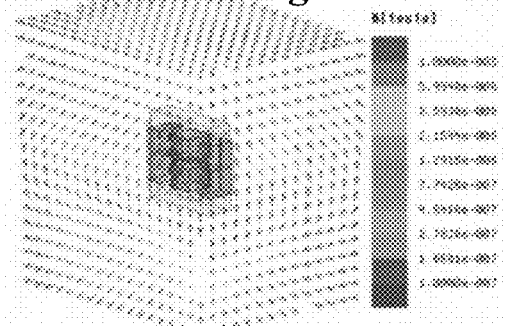
FIG. 15C shows simulated magnetic field vectors for a structure 2 of FIG. 13C with 1 A DM current.
Figure 15D:
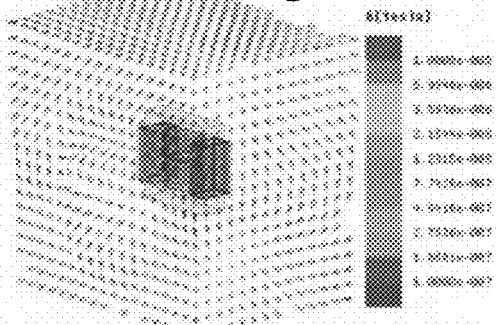
FIG. 15D shows simulated magnetic field vectors for a structure 3 of FIG. 13D with 1 A DM current.
Figure 16A:
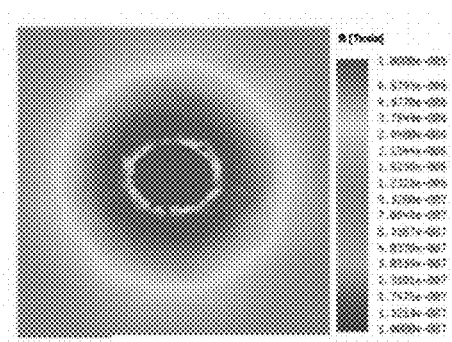
FIG. 16A shows a simulated magnetic flux density in z direction at z=−6 mm plane for a conventional integrated inductor of FIG. 13A with 1 A DM current.
Figure 16B:
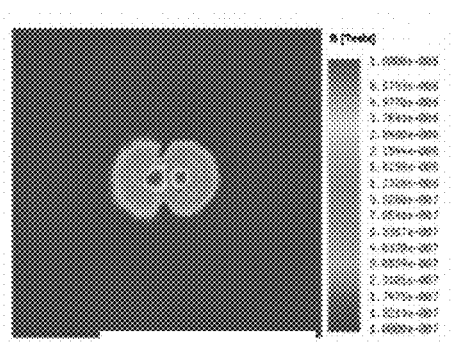
FIG. 16B shows a simulated magnetic flux density in z direction at z=−6 mm plane for a structure 1 of FIG. 13B with 1 A DM current.
Figure 16C:
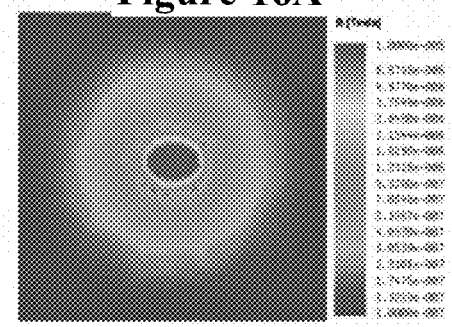
FIG. 16C shows a simulated magnetic flux density in z direction at z=−6 mm plane for a structure 2 of FIG. 13C with 1 A DM current.
Figure 16D:
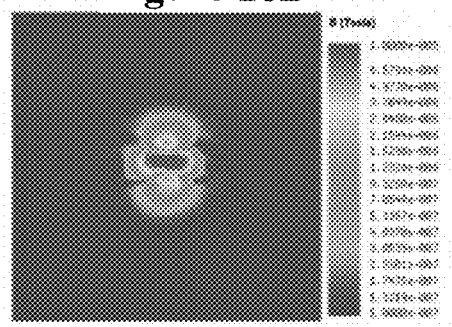
FIG. 16D shows a simulated magnetic flux density in z direction at z=−6 mm plane for a structure 3 of FIG. 13D with 1 A DM current.
Figure 17A:
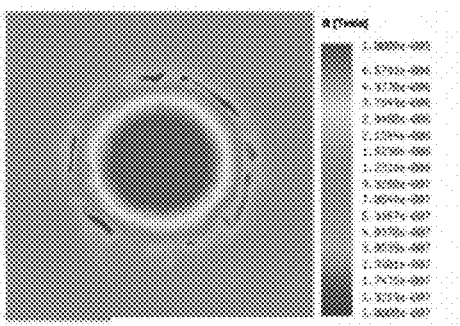
FIG. 17A shows a simulated magnetic flux density in z direction at z=50 mm plane for a conventional integrated inductor of FIG. 13A with 1 A DM current.
Figure 17B:
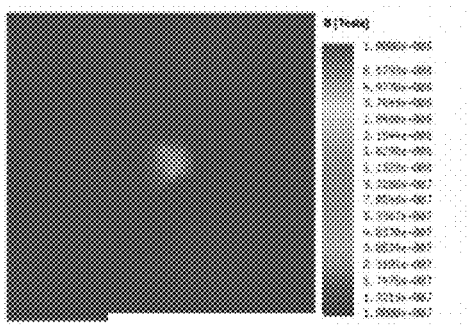
FIG. 17B shows a simulated magnetic flux density in z direction at z=50 mm plane for a structure 1 of FIG. 13B with 1 A DM current.
Figure 17C:
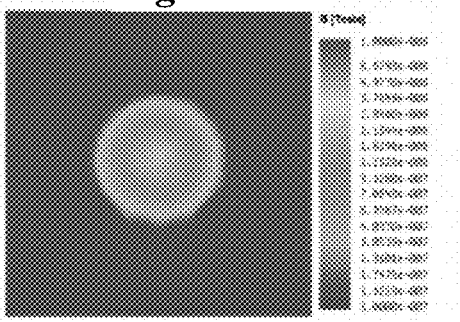
FIG. 17C shows a simulated magnetic flux density in z direction at z=50 mm plane for a structure 2 of FIG. 13C with 1 A DM current.
Figure 17D:
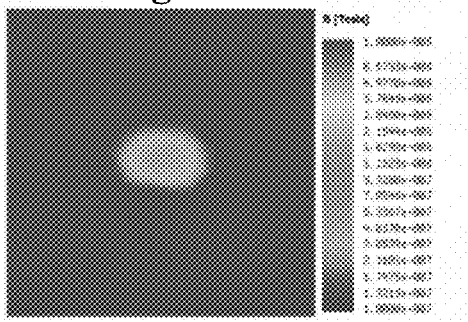
FIG. 17D shows a simulated magnetic flux density in z direction at z=50 mm plane for a structure 3 of FIG. 13D with 1 A DM current.
Figure 18A:
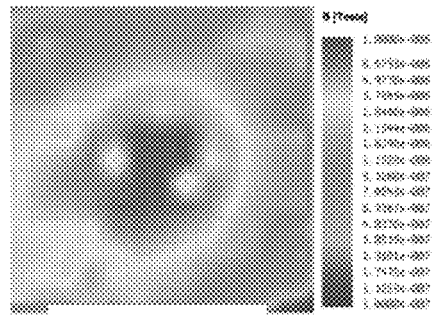
FIG. 18A shows a measured magnetic flux density in z direction at z=−6 mm plane for a conventional integrated inductor of FIG. 13A with 1 A DM current.
Figure 18B:
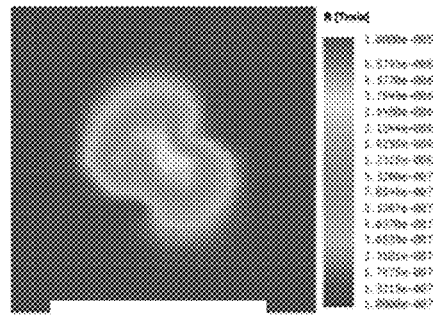
FIG. 18B shows a measured magnetic flux density in z direction at z=−6 mm plane for a structure 1 of FIG. 13B with 1 A DM current.
Figure 18C:
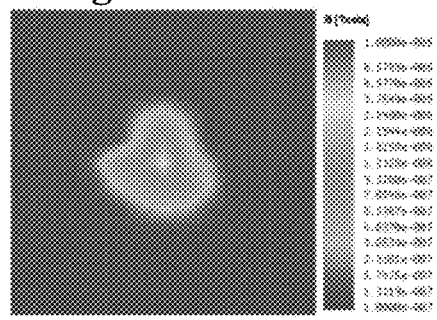
FIG. 18C shows a measured magnetic flux density in z direction at z=−6 mm plane for a structure 2 of FIG. 13C with 1 A DM current.
Figure 18D:
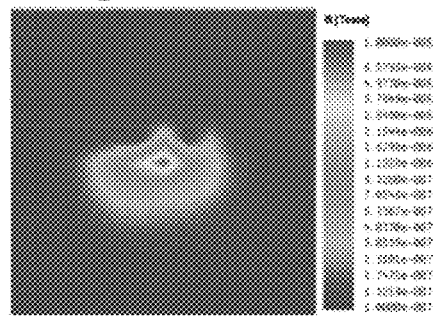
FIG. 18D shows a measured magnetic flux density in z direction at z=−6 mm plane for a structure 3 of FIG. 13D with 1 A DM current.
Figure 19A:
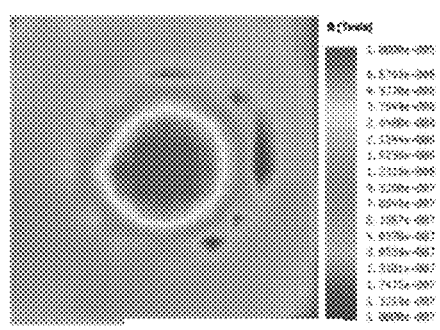
FIG. 19A shows a measured magnetic flux density in z direction at z=50 mm plane for a conventional integrated inductor of FIG. 13A with 1 A DM current.
Figure 19B:
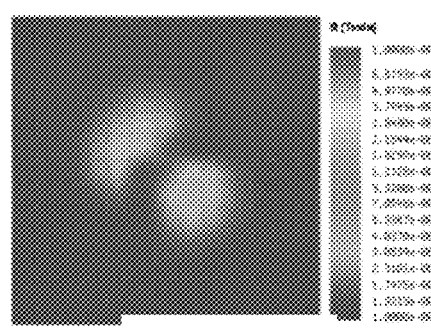
FIG. 19B shows a measured magnetic flux density in z direction at z=50 mm plane for a structure 1 of FIG. 13B with 1 A DM current.
Figure 19C:
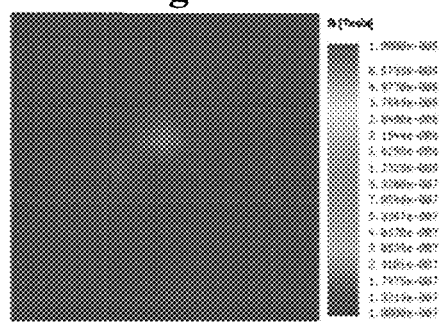
FIG. 19C shows a measured magnetic flux density in z direction at z=50 mm plane for a structure 2 of FIG. 13C with 1 A DM current.
Figure 19D:
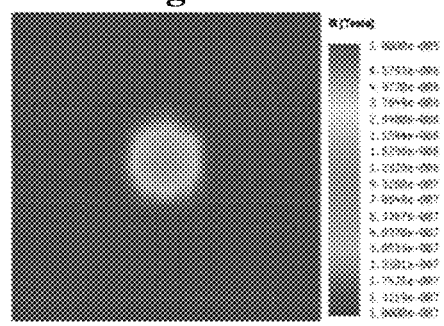
FIG. 19D shows a measured magnetic flux density in z direction at z=50 mm plane for a structure 3 of FIG. 13D with 1 A DM current.

Simulation verifications are conducted in ANSYS Maxwell 3D. FIGS. 15A-15D shows the simulated magnetic field vectors in the space close to the integrated inductors with 1 A DM current. FIG. 15A shows simulated magnetic field vectors of the conventional integrated inductor of FIG. 13A, FIG. 15B shows simulated magnetic field vectors of Structure 1 of FIG. 13B, FIG. 15C shows simulated magnetic field vectors of Structure 2 of FIG. 13C, and FIG. 15D shows simulated magnetic field vectors of Structure 3 of FIG. 13D. The magnetic flux density color maps are on a logarithmic scale throughout the paper. The comparison shows that all three structures of embodiments of the subject invention have a much lower near magnetic field than the conventional integrated inductor as expected.

Figure 20:
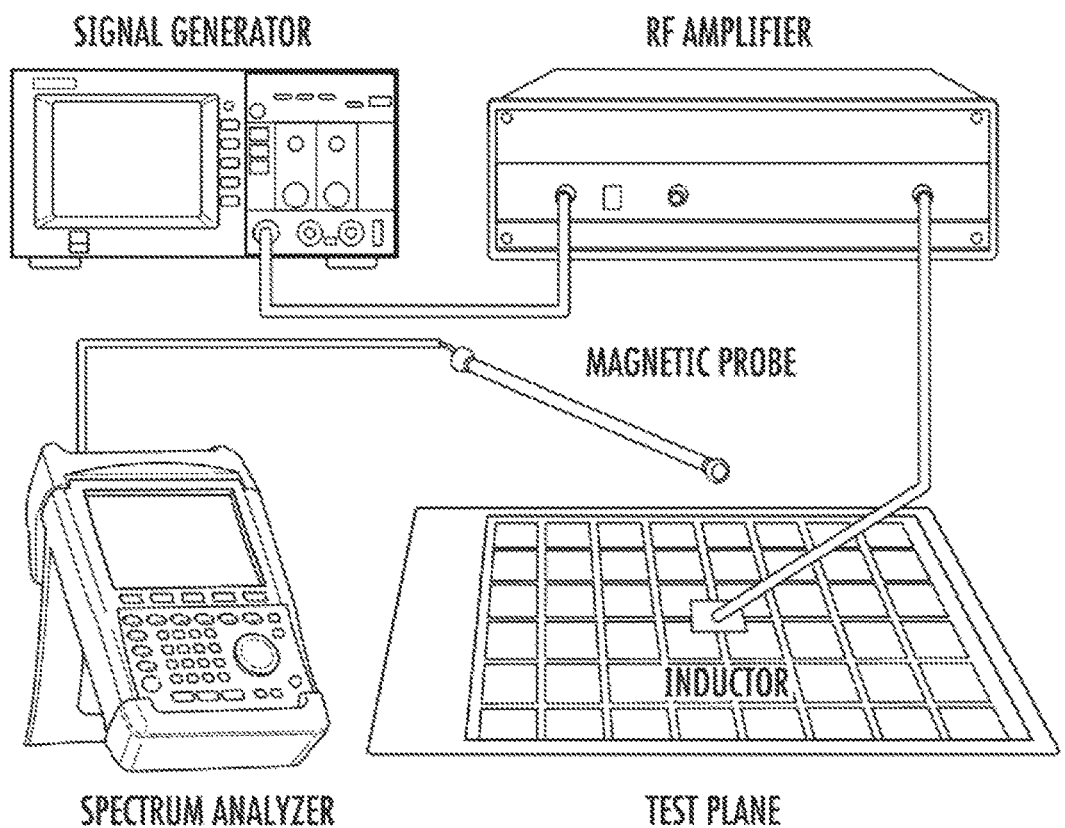
FIG. 20 shows a near magnetic field test setup.
Figure 21A:
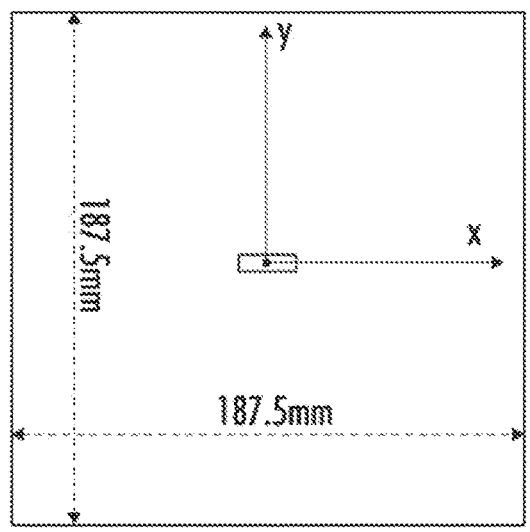
FIG. 21A shows a top view of a test plane of the test setup of FIG. 20.
Figure 21B:
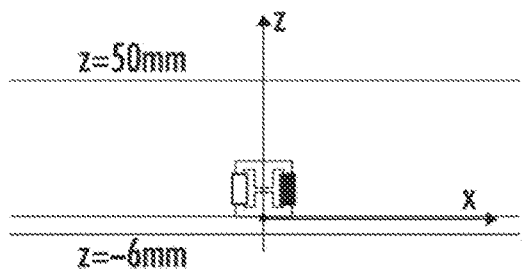
FIG. 21B shows a side view of a test plane of the test setup of FIG. 20.

FIG. 20 shows a near magnetic field test setup, and FIGS. 21A and 21B show a top view and a side view of the test plane of the test setup of FIG. 20. Referring to FIG. 20, a signal generator RIGOL DS1052E, a Beehive Electronics 100-A EMC probe, a 25 W RF amplifier (model 25A250A) and a Rohde & Schwarz FSH4 spectrum analyzer were used. A 200 kHz sinusoidal voltage signal from the signal generator was amplified by the RF amplifier and connected to the inductors. A current probe was used to monitor and make sure the input DM current is 1 A. The inductors were placed in the center of a coordinated board as shown in FIG. 21A. The coordinated board has an area of 187.5 mm×187.5 mm and has 13×13=169 points on an equally spaced grid. The EMC probe was connected to the spectrum analyzer. The magnetic flux density on the planes at z=−6 mm and z=50 mm was measured point by point as shown in FIG. 21B.

Due to the limited space, only the magnetic flux density on z direction is simulated and measured. The magnetic flux density in x and y directions can be simulated and measured similarly. The near magnetic field in z direction can easily couple to the components which have big projection areas on x-y plane. FIGS. 16A-16D and 17A-17D show the simulated magnetic flux density in z direction at z=−6 mm and z=50 mm planes, respectively, for the integrated inductors with 1 A DM current. The magnetic field is stronger at z=−6 mm because it is closer to the inductors than z=50 mm. FIGS. 18A-18D and 19A-19D show the experimental results. They match the simulated results very well. There is a ring with magnetic flux density lower than the areas around it in some results. This is because that the magnetic field are mostly on the x or y direction in the ring area. Again, both simulation and experimental results validate that the structures of embodiments of the subject invention have a much lower near magnetic field emission than the conventional integrated inductor.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

The invention claimed is:

1. An integrated common mode and differential mode inductor, comprising:

a first core comprising a first center leg, a first left leg, and a first right leg;

a second core comprising a second center leg, a second left leg, and a second right leg;

a first center winding on the first center leg;
a second center winding on the second center leg;
a left winding on the first left leg and the second left leg; and
a right winding on the first right leg and the second right leg,
wherein the first center leg is spaced apart from the second center leg,
wherein the first right leg and the second right leg form a right leg defining a right leg reluctance, the first left leg and the second left leg form a left leg defining a left leg reluctance that is substantially equal to the right leg reluctance, and the first center leg and the second center leg form a center leg defining a center leg reluctance,
wherein the right winding comprises a first number of windings and the left winding comprises a second number of windings, the first number of windings being equal to the second number of windings,
wherein the first center winding comprises a third number of windings and the second center winding comprises a fourth number of windings, the third number of windings being equal to the fourth number of windings,
wherein the first number of windings and the third number of windings are configured such that a ratio of the first number of windings to the right leg reluctance is substantially equal to a ratio of the third number of windings to the center leg reluctance,
wherein each current direction of the first center winding and the second center winding is configured such that both a common mode flux and a differential mode flux flow through the first left leg, the second left leg, the first right leg, and the second right leg and only one of either (a) the common mode flux or (b) the differential mode flux flows through the first center leg and the second center leg, and
wherein the current direction of a differential mode current through the first center winding defines a first direction and (a) when the common mode flux flows through the first center leg and the second center leg, the current direction of a common mode current through the second center winding is in the first direction, and (b) when the differential mode flux flows through the first center leg and the second center leg, the current direction of the differential mode current through the second center winding is in the first direction.

2. The integrated common mode and differential mode inductor according to claim 1, wherein the first center leg is spaced apart from the second center leg by a center air gap, wherein the first left leg is spaced apart from the second left leg by a left air gap and the first right leg is spaced apart from the second right leg by a right air gap.

3. The integrated common mode and differential mode inductor according to claim 2, wherein the left air gap, the right air gap, and the center air gap have the same thickness.

4. The integrated common mode and differential mode inductor according to claim 1, wherein the left winding and the first center winding are configured to be connected to a positive line, and the right winding and the second center winding are configured to be connected to a negative line.

5. The integrated common mode and differential mode inductor according to claim 4, wherein each current direction of the left, right, first center, and second center windings is configured such that a differential mode flux flows through the first left, second left, first right, and second right legs, and a common mode flux flows through the first left, second left, first right, second right, first center, and second center legs.

6. The integrated common mode and differential mode inductor according to claim 4, wherein each current direction of the left, right, first center, and second center windings is configured such that a common mode flux flows through the first left, second left, first right, and second right legs, and a differential mode flux flows through the first left, second left, first right, second right, first center, and second center legs.

7. The integrated common mode and differential mode inductor according to claim 1, further comprising:
a first left winding wound around the first left leg and a second left winding wound about the second left leg;
a first right winding wound about the first right leg and a second right winding wound about the second right leg.

8. The integrated common mode and differential mode inductor according to claim 7, wherein the first left leg is directly connected to the second left leg.

9. The integrated common mode and differential mode inductor according to claim 8, wherein the first right leg is directly connected to the second right leg.

10. The integrated common mode and differential mode inductor according to claim 9, wherein the first left winding, the first right winding, and the first center winding are configured to be connected to a positive line and wherein the second left winding, the second right winding, and the second center winding are configured to be connected to a negative line.

11. The integrated common mode and differential mode inductor according to claim 10, wherein each of the first left winding and the first right winding has a first winding number, each of the second left winding and the second right winding has a second winding number, and the first winding number is the same as the second winding number.

12. The integrated common mode and differential mode inductor according to claim 11, wherein the first center winding has a third winding number, the second center winding has a fourth winding number, and the third winding number is the same as the fourth winding number.

13. The integrated common mode and differential mode inductor according to claim 12, wherein each winding current direction of the first left winding, the first right winding, the first center winding, the second left winding, the second right winding, and the second center winding is configured such that a common mode flux flows through the first and second left legs and the first and second right legs, and a differential mode flux flows through the first and second left leg, the first and second right leg, the first center leg, and the second center leg.

14. An integrated common mode and differential mode inductor, comprising:
a first core comprising a first left leg, a first center leg, and a first right leg;
a second core comprising a second left leg, a second center leg, and a second right leg;
a left winding wrapping the first left leg and the second left leg;
a right winding wrapping the first right leg and the second right leg;
a first center winding wrapping the first center leg; and
a second center winding wrapping the second center leg,
wherein the first right leg and the second right leg form a right leg defining a right leg reluctance, the first left leg and the second left leg form a left leg defining a left leg reluctance that is substantially equal to the right leg reluctance, and the first center leg and the second center leg form a center leg defining a center leg reluctance, wherein the right winding comprises a first number of windings and the left winding comprises a second number of windings, the first number of windings being equal to the second number of windings, wherein the first center winding comprises a third number of windings and the second center winding comprises a fourth number of windings, the third number of windings being equal to the fourth number of windings, wherein the first number of windings and the third number of windings are configured such that a ratio of the first number of windings to the right leg reluctance is substantially equal to a ratio of the third number of windings to the center leg reluctance, wherein each winding current direction of the left winding, the right winding, the first center winding, and the second center winding is configured such that both a common mode flux and a differential mode flux flow through the first left leg, the second left leg, the first right leg, and the second right leg and only one of either (a) the common mode flux or (b) the differential mode flux flows through the first center leg and the second center leg, and wherein the current direction of a differential mode current through the first center winding defines a first direction and the current direction of the differential mode current through the left winding defines a second direction that is opposite the first direction, and (a) when the common mode flux flows through the first center leg and the second center leg, the current direction of the common mode current through the second center winding is in the first direction and the common mode current through the right winding is in the second direction, and (b) when the differential mode flux flows through the first center leg and the second center leg, the current direction of the differential mode current through the second center winding is in the first direction and the current direction of the differential mode current through the right winding is in the second direction.

15. The integrated common mode and differential mode inductor according to claim 14, wherein (a) the first core further comprises a first body, (b) the first left leg, first center leg, and first right leg extend from the first body, (c) the second core further comprises a second body, (d) the second left leg, second center leg, and the second right leg extend from the second body, and (e) the first left leg, the first body, the first right leg, the second right leg, the second body, and the second left leg are configured to make a loop shape.

16. The integrated common mode and differential mode inductor according to claim 14, wherein the first left leg, the first center leg, and the first right leg are spaced apart from the second left leg, the second center leg, and the second right leg, respectively, by an air gap.

17. The integrated common mode and differential mode inductor according to claim 16, wherein the first core includes an first body connected to the first left leg, the first center leg, and the first right leg, and the second core includes a second body connected to the second left leg, the second center leg, and the second right leg.

* * * * *